(12) United States Patent
Doi

(10) Patent No.: US 6,928,272 B2
(45) Date of Patent: Aug. 9, 2005

(54) DISTORTION COMPENSATING CIRCUIT FOR COMPENSATING DISTORTION OCCURRING IN POWER AMPLIFIER

(75) Inventor: Yoshiaki Doi, Tokyo (JP)

(73) Assignee: NEC Corporation, Tokyo (JP)

(*) Notice: Subject to any disclaimer, the term of this patent is extended or adjusted under 35 U.S.C. 154(b) by 423 days.

(21) Appl. No.: 10/308,104

(22) Filed: Dec. 3, 2002

(65) Prior Publication Data

US 2003/0104792 A1 Jun. 5, 2003

(30) Foreign Application Priority Data

Dec. 4, 2001 (JP) ........................... 2001-369976

(51) Int. Cl.$^7$ .................. H04B 1/04; H04B 17/00
(52) U.S. Cl. ............ 455/114.2; 455/63.1; 455/67.13; 455/126; 375/254; 375/296; 330/149
(58) Field of Search .............. 455/63.1, 67.11, 455/67.13, 114.2, 115.1, 115.3, 126, 127.1, 127.2, 423, 424; 375/254, 296; 330/127, 107, 136, 149, 150

(56) References Cited

U.S. PATENT DOCUMENTS 6,677,820 B2 * 1/2004 Miyatani .................. 330/149
6,744,315 B2 * 6/2004 Ezuka ...................... 330/149

FOREIGN PATENT DOCUMENTS

| JP | 8-78967 A | 3/1996 |
|---|---|---|
| JP | 8-251246 A | 9/1996 |
| JP | 10-150393 A | 6/1998 |
| JP | 11-177470 A | 7/1999 |
| JP | 11-239191 A | 8/1999 |
| JP | 2001-16283 A | 1/2001 |
| JP | 2001-251148 A | 9/2001 |
| JP | 2001-267850 A | 9/2001 |

* cited by examiner

*Primary Examiner*—Quochien B. Vuong
(74) *Attorney, Agent, or Firm*—Sughrue Mion, PLLC

(57) ABSTRACT

A power calculating and amplitude limitation judging portion 13 calculates the power value x of the digital quadrature baseband signal I, Q from a transmission data generator 1, and compares the power value x with a power threshold value y set by a threshold value setting portion 14 to judge whether amplitude limitation is needed or not. An amplitude maximum limiting portion 12 subjects the quadrature baseband signal from the transmission data generator 1 to the amplitude maximum value limitation based on the judgment result in the power calculating and amplitude limitation judging portion 13. Thereafter, the digital quadrature baseband signal which has been subjected to the amplitude maximum value limitation by the amplitude maximum value limiting portion 12 is subjected to the distortion compensation using complex multiplication based on the distortion compensation data by a non-linear distortion compensation calculator 2.

10 Claims, 10 Drawing Sheets

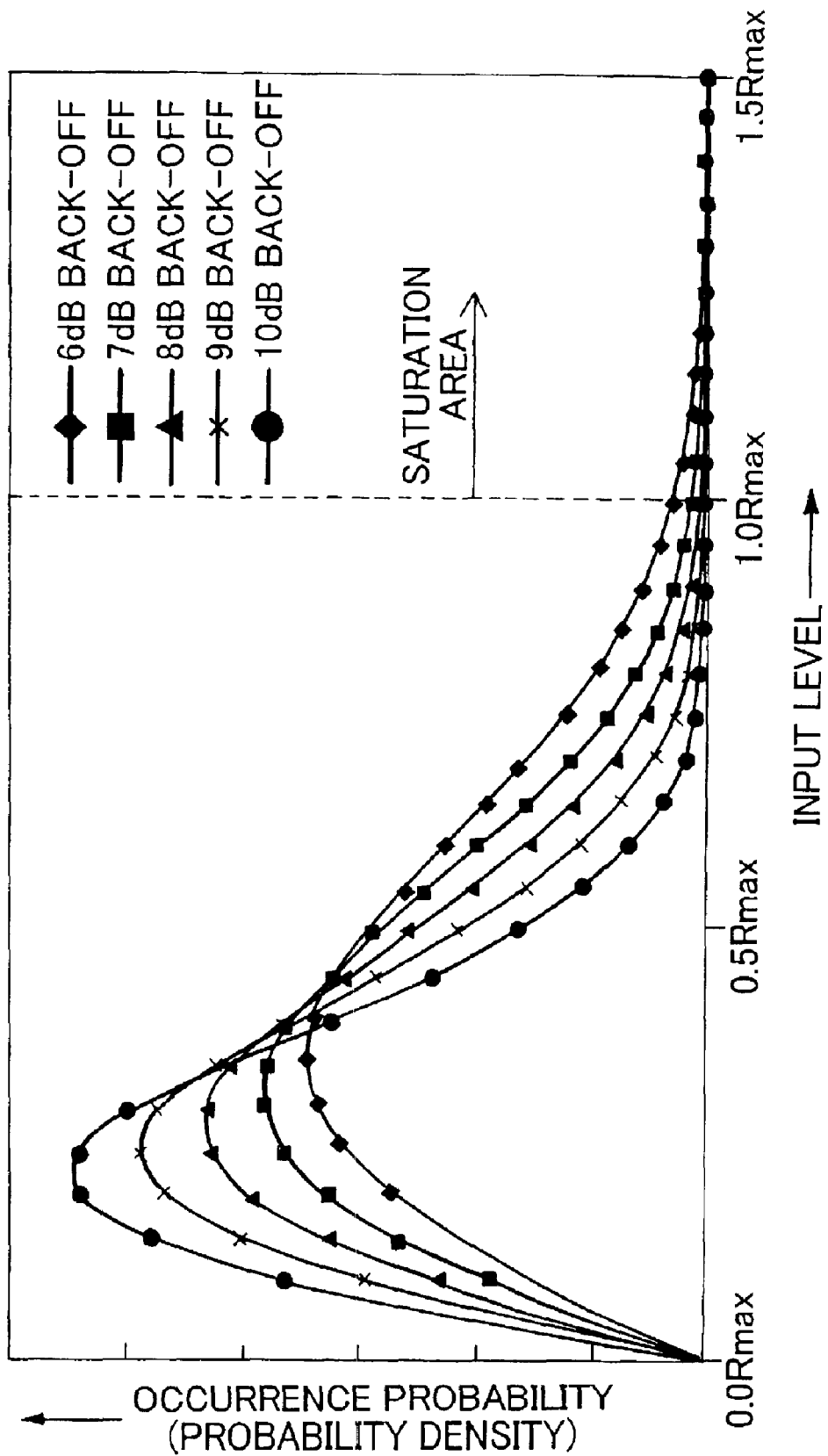

RECTANGULAR CLIPPING

CIRCULAR CLIPPING

DISTORTION COMPENSATING CIRCUIT FOR COMPENSATING DISTORTION OCCURRING IN POWER AMPLIFIER

BACKGROUND OF THE INVENTION

1. Field of the Invention

The present invention relates to a distortion compensating circuit that is usable for a radio transmission device of a base station or the like in a wireless communication system and serves to compensate distortion occurring in amplifying means such as a power amplifier or the like.

2. Description of the Related Art

In order to suppress adjacent channel leakage power, it is ideal for a radio transmission device in a wireless communication system to use a power amplifier having excellent linearity in all the amplitude components. However, if a power amplifier is designed to have excellent linearity to even remarkably large amplitude components, the scale of the power amplifier is large, the price thereof is high and the power consumption is also large. Therefore, there may be such a case that a power amplifier having excellent linearity to small amplitude components, but having non-linearity to large amplitude components must be used. When such a power amplifier is used, the adjacent channel leakage power would be increased if amplitude components having larger power levels than the effective power are amplified.

Therefore, various distortion compensating techniques have been proposed in order to suppress the adjacent channel leakage power due to non-linear distortion of power amplifiers. A feed-forward type, a Cartesian feedback type and a pre-distortion type have been proposed as representative distortion compensating techniques. With respect to the feed-forward type, it is difficult to enhance the efficiency because it structurally needs an error amplifier. Therefore, the distortion compensation based on the Cartesian feedback type or the pre-distortion type with which the distortion compensation on the digital quadrature coordinates in the baseband can be performed have been recently considered from the viewpoint of reduction of the cost and enhancement of the efficiency (see JPA-8-78967, JPA-8-251246, for example).

In the Cartesian feedback type, the distortion improvement amount is proportional to the loop gain, so that it is difficult to increase a distortion-improvable band width in order to enhance the distortion improvement degree and keep the loop stability for negative feedback. Accordingly, the pre-distortion type which can increase the band width is more effective to a mobile communication system, and thus the following description will be made by exemplifying the pre-distortion type.

FIG. 1 is a block diagram showing an example of the construction of a radio transmission device having a pre-distortion type distortion compensating circuit based on a prior art. The conventional radio transmission device comprises transmission data generator 1, D/A converters $3_1$, $3_2$, quadrature modulator 4, reference signal generator 5, power amplifier 6 and distortion compensating circuit 30. The distortion compensating circuit 30 comprises non-linear distortion compensating calculator 2, directional coupler 7, quadrature demodulator 8, A/D converters $9_1$, $9_2$, power calculator 10, and error calculation and compensation data renewing unit 11.

In the non-linear distortion compensating calculator 2, digital quadrature baseband signals I, Q (in-phase signal and quadrature signal) from the transmission data generator 1 are subjected to distortion compensation calculation using complex-multiplication based on distortion compensating data which are calculated in advance. The quadrature baseband signals I', Q' after the distortion compensation calculation is carried out are converted to analog signals by the D/A converters $3_1$, $3_2$ to thereby achieve analog quadrature baseband signals. Subsequently, in the quadrature modulator 4, the analog quadrature baseband signals are converted to a quadrature modulation signal on the basis of a signal from the reference signal generator 5. Thereafter, the quadrature modulation signal is subjected to power amplification in the power amplifier 6, and output as an RF output.

A part of the output of the power amplifier 6 is fed back to the quadrature demodulator 8 by the directional coupler 7, and demodulated to the analog quadrature baseband signals on the basis of the signal from the reference signal generator 5. Further, the analog quadrature baseband signals are converted to digital signals by the A/D converters $9_1$, $9_2$ to thereby achieve digital quadrature baseband signals I" and Q". The digital quadrature baseband signals I" and Q" thus fed back and the input quadrature baseband signals I and Q from the transmission data generator 1 are respectively compared with each other in the error calculation and compensation data renewing unit 11 to renew the distortion compensation data. In the non-linear distortion compensation calculator 2, the distortion compensation data are referred to on the basis of the distortion compensation data thus renewed by using the power value from the power calculator 10 as an address to thereby perform the distortion compensation.

FIG. 2 is a block diagram showing the construction of the error calculation and compensation data renewing unit 11 shown in FIG. 1.

The error calculation and compensation data renewing unit 11 comprises distortion compensation data memory 41 and distortion compensation data calculator 42 as shown in FIG. 2.

The distortion compensation data calculator 42 compares the quadrature baseband transmission signals I, Q and the feedback signals I", Q" on the polar coordinates to calculate an amplification error and a phase error. The distortion compensation data memory 41 stores the distortion compensation data calculated in the distortion compensation data calculator 42 while associating the distortion compensation data with the power values.

The construction described above is an example of the prior art, and other constructions using a digital system for quadrature modulation, quadrature demodulation or using a frequency converter without using direct modulation have been proposed.

Further, other construction for carrying the following calculation has been proposed: The distortion compensation calculation is carried out while an amplification value corresponding to the square root of a power value from an amplification calculator is used as an address in place of using the power value from the power calculator 10 as an address.

The conventional pre-distortion type and Cartesian feedback type distortion compensation circuits compensate only non-linear distortion in AM/AM characteristic (amplification characteristic) and AM/PM characteristic (phase characteristic) occurring in the power amplifier 6, etc. Multiplexed modulation waves based on CDMA (code Division Multiple Access) modulation or OFDM (Orthogonal Frequency Division Multiplexing) modulation contain amplitude components in which the instantaneous power of an envelope is remarkably larger than the effective power, and thus clipping distortion occurs in a saturated area. However, in the conventional pre-distortion type and Cartesian feedback type distortion compensation circuits, the clipping distortion components cannot be compensated.

Furthermore, there is also such a disadvantage that the amplitude compensation when the distortion compensation is carried out causes the signal amplitude after compensation to reach the saturated area of the power amplifier for even instantaneous input amplitude components which are lower than the saturation input in the case of non-compensation by several dB (decibel), thereby increasing clipping distortion, so that the distortion compensation increasing clipping distortion, so that the distortion compensation effect is lowered.

A distortion compensation circuit for suppressing very large instantaneous amplitude components of an envelope which causes the above problem has been proposed in JPA-2001-251148.

FIG. 3 shows the construction of an error calculation and compensation data renewing unit of another conventional distortion compensation circuit as disclosed in JP-2001-251148. In FIG. 3, the same constituent elements as shown in FIG. 2 are represented by the same reference numerals, and the description thereof is omitted.

As shown in FIG. 3, the error calculation and compensation data renewing unit 11a comprises distortion compensation data memory 41, distortion compensation data calculator 42, selector 43, comparator 44 and distortion compensation data correcting portion 45.

The comparator 44 compares a preset upper limit power value Pmax and the power value of signals I', Q' achieved by conducting the distortion compensation calculation on input quadrature baseband transmission signals I, Q with distortion compensation data calculated in the distortion compensation data calculator 42. The distortion compensation data correcting unit 45 corrects the distortion compensation data calculated in the distortion compensation data calculator 42 so that the amplitude compensation coefficient is equal to 1/m, and outputs the corrected distortion compensation data. Here, m represents the amplitude limiting coefficient, and it is calculated from m=(the power of the quadrature baseband transmission signal after distortion compensation calculation/Pmax)$^{1/2}$.

If it is judged in the comparator 44 that the power value of the signals I', Q' after the distortion compensation calculation is carried out on the input quadrature baseband transmission signal is larger than the power value Pmax, the selector 43 selects the distortion compensation data from the distortion compensation data correcting portion 45 and outputs it to the distortion compensation data memory 41. If it is judged in the comparator 44 that the power of the signals after the distortion compensation is carried out on the input quadrature baseband transmission signal is not more than the power value Pmax, the selector 43 selects the distortion compensation data from the distortion compensation data calculator 42 and outputs it to the distortion compensation data memory 41.

When the power value of the quadrature baseband signals I', Q' after the distortion compensation calculation is larger than the fixed value Pmax, the other conventional distortion circuit described above can correct the magnitude of the amplitude compensation coefficient with keeping the phase to the input signals and limit the signal amplitude after the distortion compensation. However, in this conventional technique, the amplitude of the quadrature baseband signals I, Q input to the distortion compensation data calculator 42 is not limited because the amplitude compensation coefficient itself in the non-linear distortion compensation calculator 2 is multiplied by the amplitude limiting coefficient for amplitude limitation and then stored in the distortion compensation data memory 41. Accordingly, in the construction of the conventional technique described above, the amplitude-limited feedback signal from the power amplifier 6 and the amplitude non-limited quadrature baseband signal are compared with each other to calculate the distortion compensation data. Therefore, by the conventional distortion compensation circuit having the construction as described above, accurate error correction cannot be performed and the distortion compensation cannot be performed with high precision.

The conventional distortion compensation circuit as described above has the disadvantage that the accurate error calculation cannot be performed because the input quadrature baseband signal before the amplitude limitation is carried out and the feedback signal after the amplitude limitation is carried out are compared with each other to perform the error calculation.

SUMMARY OF THE INVENTION

Therefore, an object of the present invention is to provide a distortion compensation circuit which can implement reduction of clipping distortion components with correctly performing error calculation, and greatly enhance the effect of non-linear distortion compensation carried out subsequently.

In order to attain the above object, according to a first aspect of the present invention, there is provided a distortion compensating circuit for compensating distortion occurring in amplifying means equipped for a radio transmission device, comprising:

power calculating and amplitude limitation judging means for calculating the power value of a quadrature baseband transmission signal, judging whether the power value thus calculated is not less than a predetermined power threshold value, outputting as a multiplication coefficient such a coefficient that the power value of the quadrature baseband transmission signal is equal to or less than the power threshold value when the power value thus calculated is larger than the power threshold value, and outputting as a multiplication coefficient such a coefficient that the quadrature baseband transmission signal is left unchanged when the power value thus calculated is not larger than the power threshold value;

amplitude maximum value limiting means for performing amplitude maximum value limitation based on circular clipping which is implemented by multiplying each of I and Q components of the quadrature baseband transmission signal by the multiplication coefficient from the power calculating and amplitude limitation judging means;

error calculation and compensation data renewing unit for performing the error calculation between the quadrature baseband transmission signal after the amplitude thereof has been limited by the amplitude maximum value limiting means and the quadrature baseband signal fed back from the output of the amplifying means to renew distortion compensation data for compensating non-linear distortion; and non-linear distortion compensation calculating means for performing, on the basis of the compensation data from the error calculation and compensation data renewing means, distortion compensation on the quadrature baseband transmission signal after the amplitude thereof has been limited by the amplitude maximum value limiting means.

According to a second aspect of the present invention, there is provided a distortion compensating circuit for compensating distortion occurring in amplifying means equipped for a radio transmission device, comprising:

amplitude calculating and amplitude limitation judging means for calculating the amplitude value of a quadrature baseband transmission signal, judging whether the amplitude value thus calculated is not less than a predetermined amplitude threshold value, outputting as a multiplication coefficient such a coefficient that the amplitude value of the quadrature baseband transmission signal is equal to or less than the amplitude threshold value when the amplitude value thus calculated is larger than the amplitude threshold value, and outputting as a multiplication coefficient such a coefficient that the quadrature baseband transmission signal is left unchanged when the amplitude value thus calculated is not larger than the amplitude threshold value;

amplitude maximum value limiting means for performing amplitude maximum value limitation based on circular clipping which is implemented by multiplying each of I and Q components of the quadrature baseband transmission signal by the multiplication coefficient from the amplitude calculating and amplitude limitation judging means;

error calculation and compensation data renewing unit for performing the error calculation between the quadrature baseband transmission signal after the amplitude thereof has been limited by the amplitude maximum value limiting means and the quadrature baseband signal fed back from the output of the amplifying means to renew distortion compensation data for compensating non-linear distortion; and non-linear distortion compensation calculating means for performing, on the basis of the compensation data from the error calculation and compensation data renewing means, distortion compensation on the quadrature baseband transmission signal after the amplitude thereof has been limited by the amplitude maximum value limiting means.

According to the present invention, the instantaneous signal amplitude at the amplifying means input is limited by the construction that the non-linear distortion compensation is made after the amplitude maximum value limitation based on the circular clipping is carried out, whereby a clipping distortion component due to the instantaneous amplitude of the envelope can be suppressed and then the distortion compensation effect can be enhanced.

In the above distortion compensating circuit of the present invention, the power threshold value may be set on the basis of an output back-off amount at an operating point of the amplifying means.

According to the present invention, when the instantaneous signal amplitude is limited, the amplitude limitation based on the circular clipping is carried out on amplitude components larger than the power threshold value which is set for the power value of the input quadrature baseband signal, and the optimum setting of the amplitude maximum value limitation value based on the power threshold value corresponding to the output back-off amount of the amplifying means is performed in advance, whereby the distortion compensation can be performed with minimizing the deterioration of the modulation precision of the transmission system.

Furthermore, in the distortion compensation circuit of the present invention, a judgment as to whether the amplitude maximum value limitation is performed on the basis of the amplitude threshold value of the quadrature baseband transmission signal may be made.

BRIEF DESCRIPTION OF THE DRAWINGS

FIG. 8 is a diagram showing the occurrence probability to the input level of an envelope based on Rayleigh distribution under each back-off condition;

FIGS. 9A and 9B are diagrams showing a maximum value limiting method of transmission data, wherein FIG. 9A is a diagram showing the maximum value limitation every component on the quadrature coordinates based on rectangular clipping and FIG. 9B is a diagram showing the amplitude maximum value limitation based on circular clipping.

DETAILED DESCRIPTION OF THE PREFERRED EMBODIMENTS

Preferred embodiments according to the present invention will be described with reference to the accompanying drawings. In order to simplify the description, it is assumed in the following description that distortion occurs only in a power amplifier.

(First Embodiment)

Figure 4:
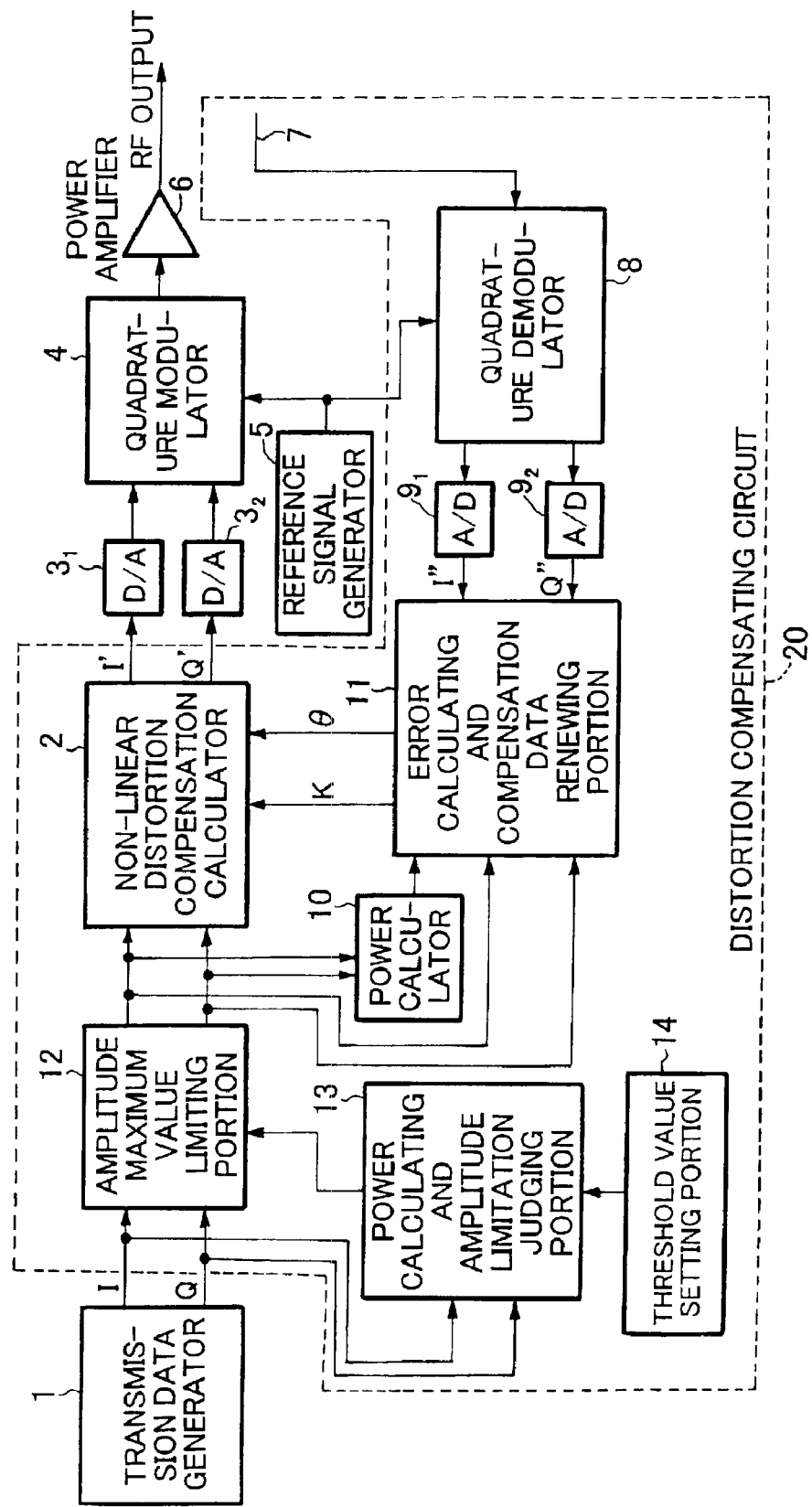
FIG. 4 is a block diagram showing the construction of a radio transmission device according to a first embodiment of the present invention.

FIG. 4 is a block diagram showing the construction of a radio transmission device having a distortion compensating circuit according to a first embodiment of the present invention. In FIG. 4, the same parts as the prior art shown in FIG. 1 are represented by the same reference numerals.

Figure 1:
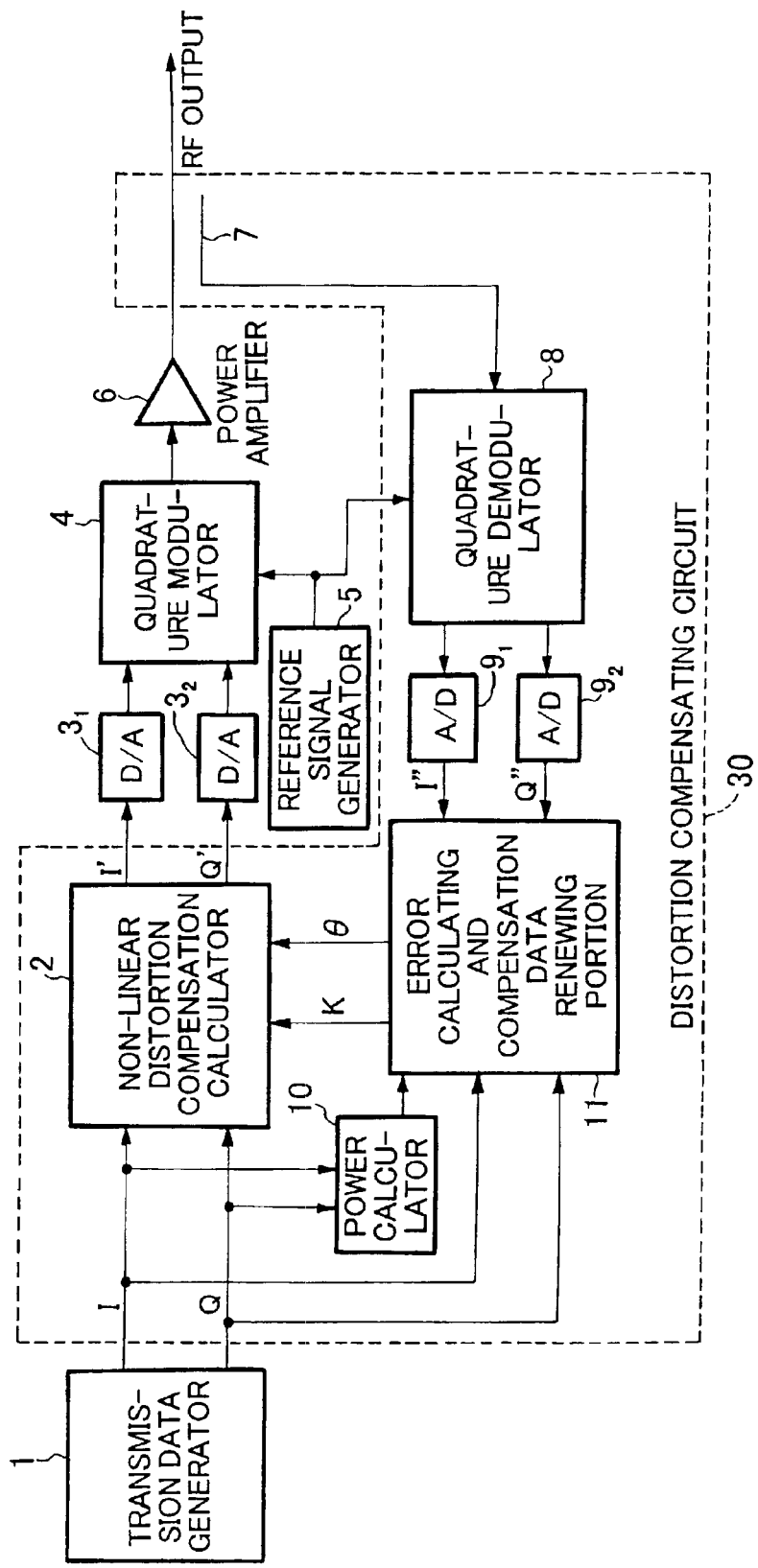
FIG. 1 is a block diagram showing an example of the construction of a radio transmission device having a conventional pre-distortion type distortion compensating circuit.
Figure 2:
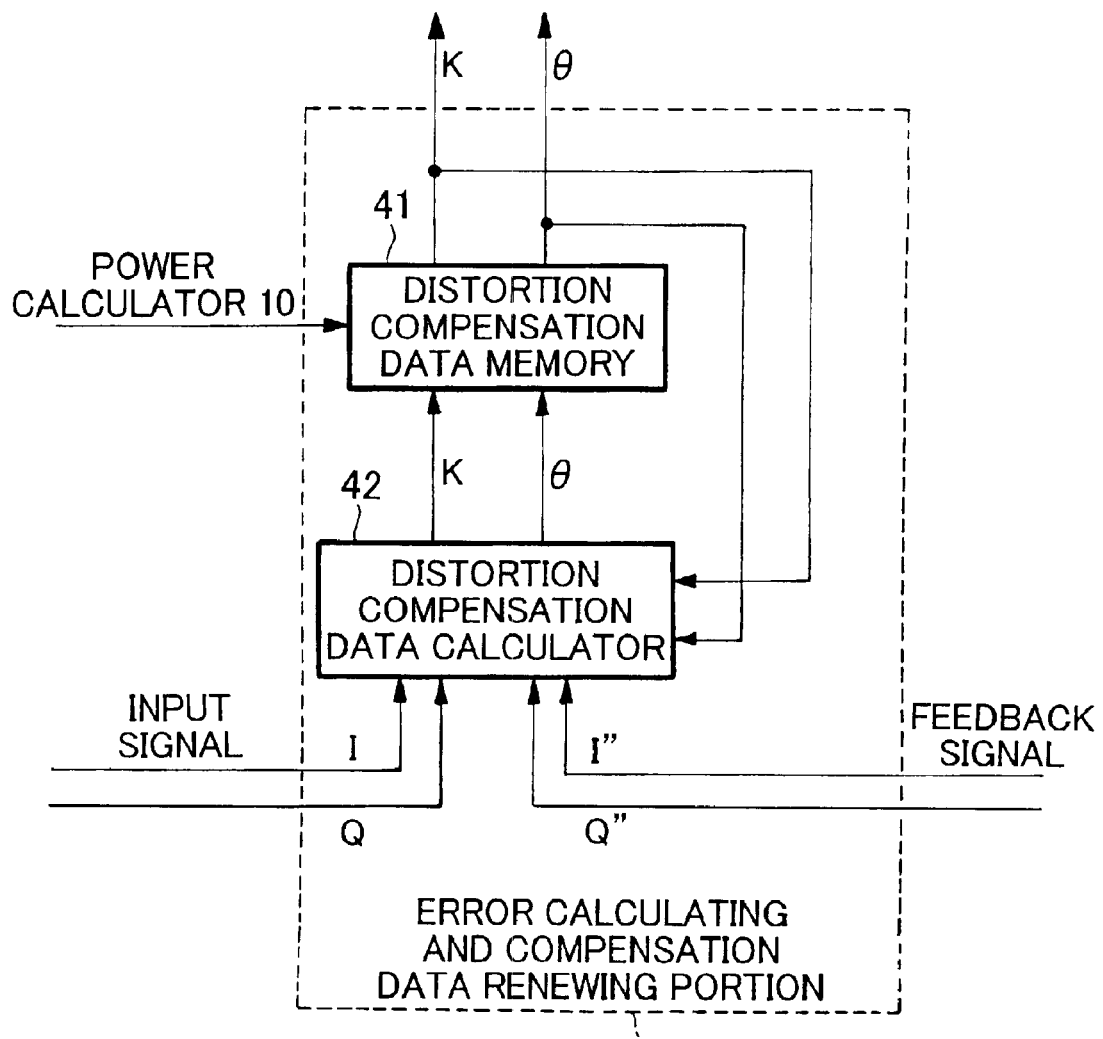
FIG. 2 is a block diagram showing the construction of an error calculation and compensation data renewing portion in FIG. 1.
Figure 3:
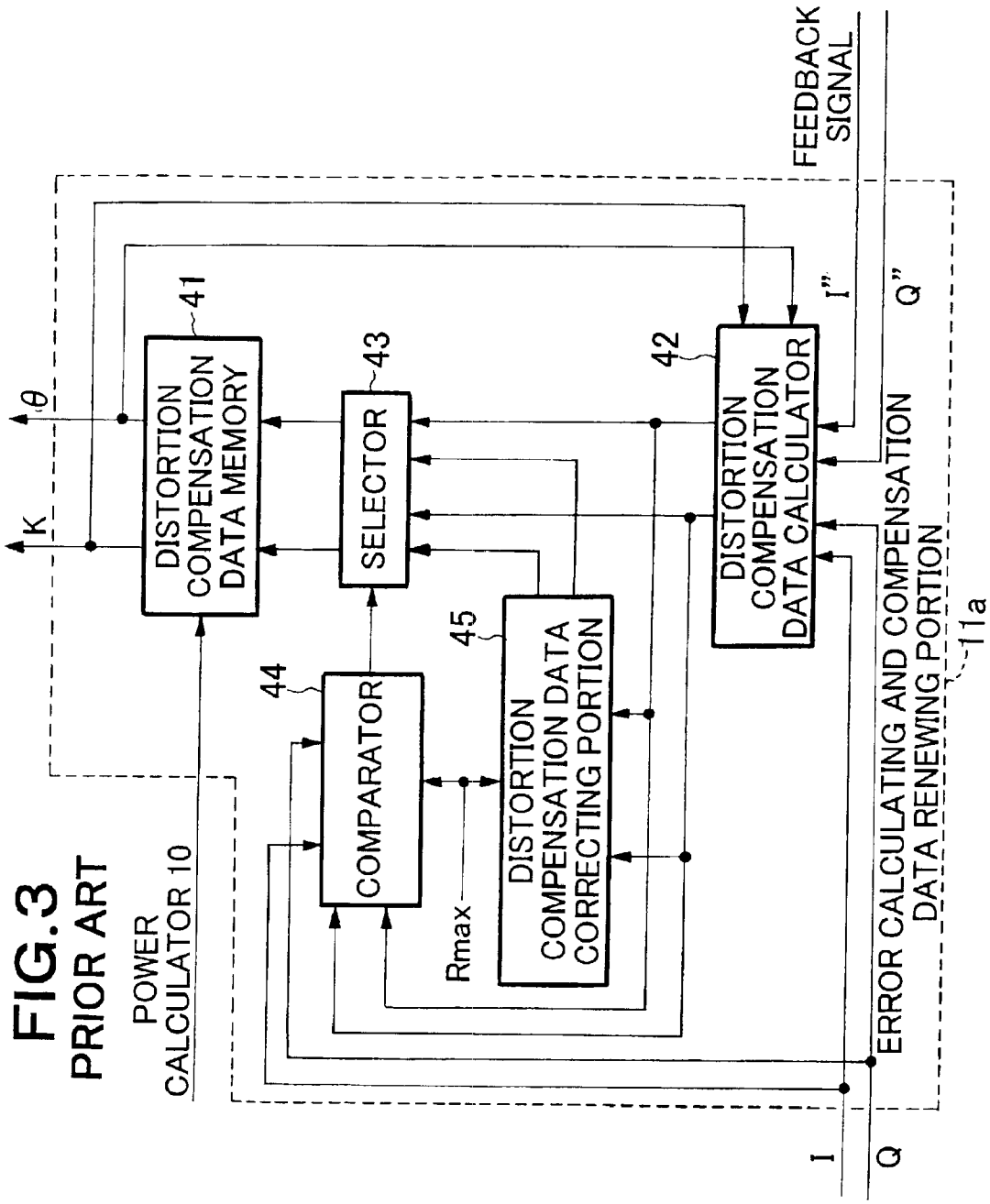
FIG. 3 is a block diagram showing the construction of an error calculating and compensation data renewing portion of another conventional distortion compensating circuit.

The difference between the radio transmission device of this embodiment and the conventional radio transmission device shown in FIG. 1 resides in that the distortion compensating circuit 30 is replaced by a distortion compensating circuit 20. The distortion compensating circuit 20 of this embodiment is different from the distortion compensating circuit 30 shown in FIG. 1 only in that the distortion compensating circuit 20 is further equipped with amplitude maximum value limiting portion 12, power calculating and amplitude limitation judging portion 13 and threshold value setting portion 14.

The threshold setting portion 14 sets a predetermined value as a power threshold value for the power calculating and amplitude limitation judging portion 13.

The power calculating and amplitude limitation judging portion 13 calculates the power value x of the digital quadrature baseband signals I, Q (in-phase signal and quadrature signal) from the transmission data generator 1, and judges whether the power value x thus calculated is not less than the power threshold value y set by the threshold value setting portion 14. If the power value x thus calculated is larger than the power threshold value y, the power calculating and amplitude limitation judging portion 13 determines that the amplitude limitation is carried out, and outputs $(y/x)^{1/2}$ as a multiplication coefficient. On the other hand, if the power value x thus calculates is not more than the power threshold value y, it determines that no amplitude limitation is carried out, and outputs "1" as a multiplication coefficient.

In the following description, it is assumed that the power calculating and amplitude limitation judging portion 13 of this embodiment outputs the coefficient of $(y/x)^{1/2}$ as a multiplication coefficient if the power value x calculated is larger than the power threshold value y. However, any other coefficients may be used if they provides the relationship that the power value x of the digital quadrature baseband transmission signals I, Q is not more than the power threshold value y.

The amplitude maximum value limiting portion 12 carries out the amplitude maximum value limitation based on circular clipping which is implemented by multiplying each of the I and Q components of the quadrature baseband transmission signal from the transmission data generator 1 by the multiplication coefficient from the power calculating and amplitude limitation judging portion 13.

The method of performing the distortion compensation using the complex multiplication based on the distortion compensation data in the non-linear distortion compensation calculator 2, on the digital quadrature baseband signal which has been subjected to the amplitude maximum limitation by the amplitude maximum value limiting portion 12, and then renewing and referring to the compensation data thus achieved is the same as the prior art.

Figure 5:
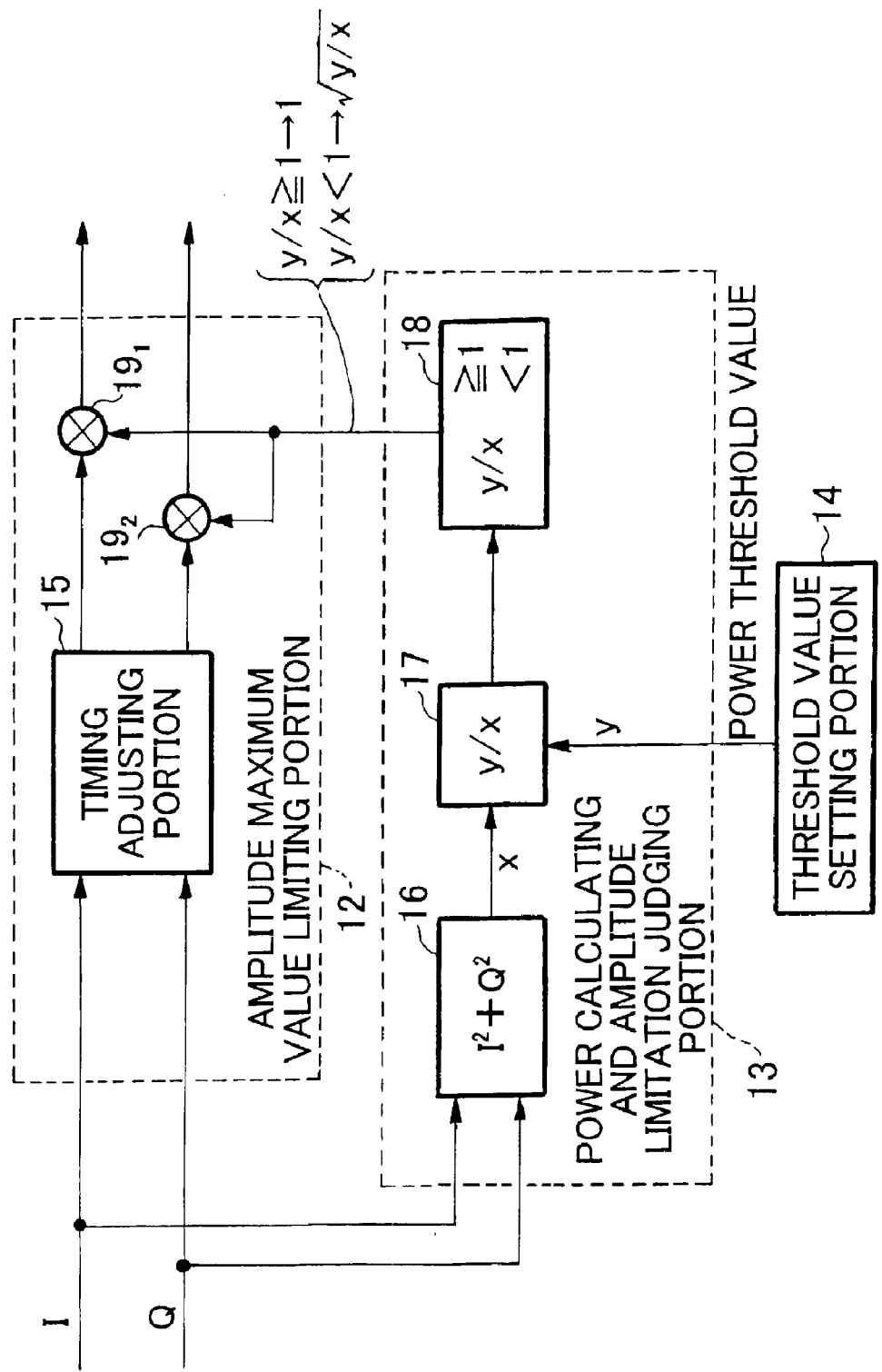
FIG. 5 is a block diagram showing the construction of an amplitude maximum value limiting portion and a power calculating and amplitude limitation judging portion in a distortion compensating circuit of the first embodiment of the present invention.

FIG. 5 shows an example of the construction of the amplitude maximum value limiting portion 12 and the power calculating and amplitude limitation judging portion 13. The amplitude maximum value limiting portion 12 comprises timing adjusting portion 15 and multipliers 19₁, 19₂. The power calculating and amplitude limitation judging portion 13 comprises power calculator 16, divider 17 and judging portion 18.

The power calculator 16 calculates the power value x (=I²+Q²) of the quadrature baseband transmission signal from the transmission data generator 1. In the divider 17, the power threshold value y set by the threshold value setting portion 14 is divided by the power value x calculated by the power calculator 16, and the division result is output as a division value y/x. If the division value y/x calculated by the divider 17 is not less than 1, the judging portion 18 outputs "1" as a multiplication coefficient. On the other hand, if the division value y/x calculated by the divider 17 is smaller than "1", the square of the division value $(y/x)^{1/2}$ is output as a multiplication coefficient.

In the amplitude maximum value limiting portion 12, the adjustment corresponding to the calculation period in the power calculating and amplitude limitation judging portion 13 is made in the timing adjusting portion 15, and then each of the I and Q components of the digital quadrature baseband signal from the transmission data generator 1 is multiplied by the multiplication coefficient from the judging portion 18 to perform the amplitude maximum value limitation based on the circular clipping.

Next, an effective analysis of this embodiment will be described with reference to the accompanying drawings.

Figure 6:
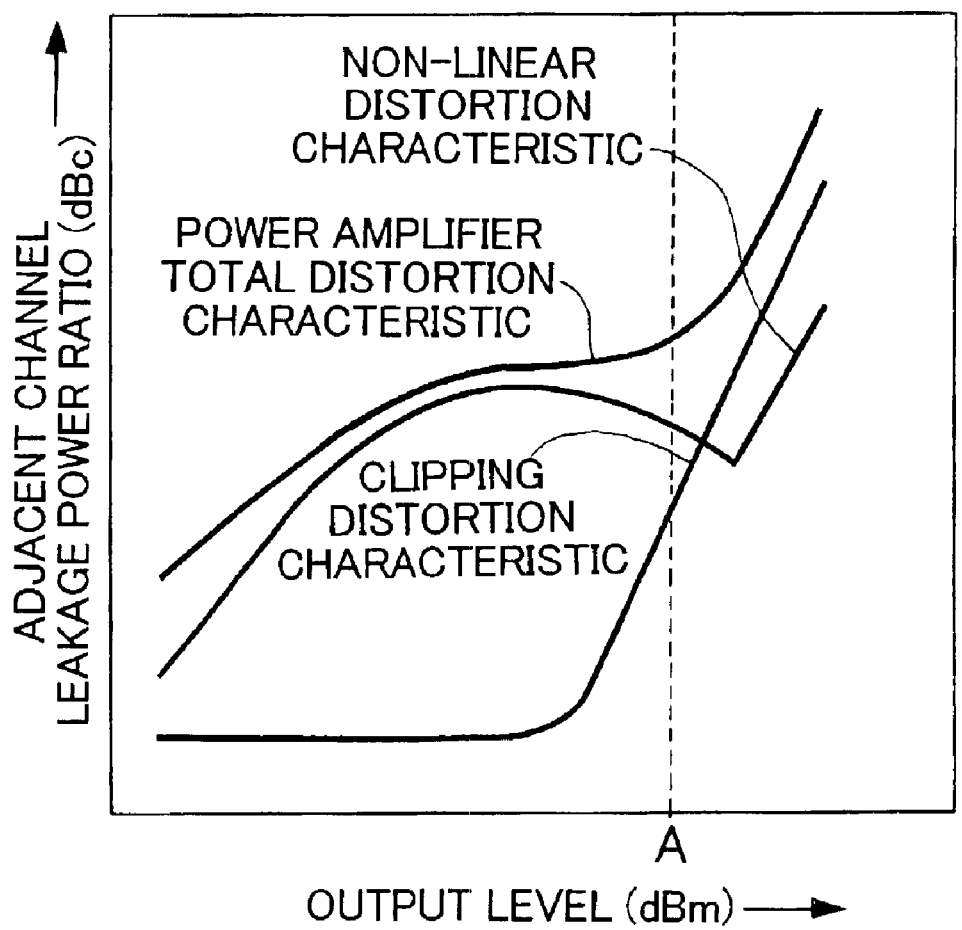
FIG. 6 is a diagram showing the relationship between non-linear distortion and clipping distortion in a general power amplifier when no distortion compensation is made.

FIG. 6 is a characteristic diagram showing the adjacent channel leakage power ratio (dBc) to the output level of a general power amplifier in which no distortion compensation is made, when one wave of a representative CDMA modulation wave signal is input. A non-linear distortion in AM/AM characteristic and AM/PM characteristic and a clipping distortion occurring due to a very large instantaneous amplitude of an envelope exist in distortions occurring in a power amplifier when multiplexed modulation waves such as CDMA modulation waves are input.

The clipping distortion characteristic shown in FIG. 6 is a leakage power ratio at some detuning frequency from the carrier center frequency when the CDMA modulation wave signal described above is input to an ideal amplifier in which the AM/AM characteristic is an ideal limiter characteristic which is linear until the saturation point and the AM/PM characteristic is flat. This characteristic does not contain any non-linear distortion in the AM/AM and AM/PM characteristics, and it shows the characteristic based on only the clipping distortion component.

Furthermore, the non-linear distortion characteristic shown in FIG. 6 is a leakage power ratio at some detuning frequency from the carrier center frequency when a signal achieved by performing the sufficient amplitude limitation on the above CDMA modulation wave signal so that the amplitude thereof does not exceed the saturation input amplitude of the power amplifier is input to the power amplifier. This characteristic does not contain any clipping distortion, and shows the characteristic based on only the non-linear distortion components in the AM/AM and AM/PM characteristic. At the output area above the "A" point shown in FIG. 6, the non-linear distortion component and the clipping distortion component contribute to the total distortion characteristic in the form of the voltage sum at the same level, and thus it is understood that even when only the non-linear distortion is compensated by the conventional distortion compensation system, only a distortion improvement amount of about 6 dB (=½) is achieved for the whole device due to the clipping distortion. That is, as in the case of the distortion compensating circuit of this embodiment, the distortion compensation effect of the whole radio transmission device can be enhanced by combining the non-linear distortion compensation and the clipping distortion suppression based on the amplitude maximum value limitation.

Figure 7:
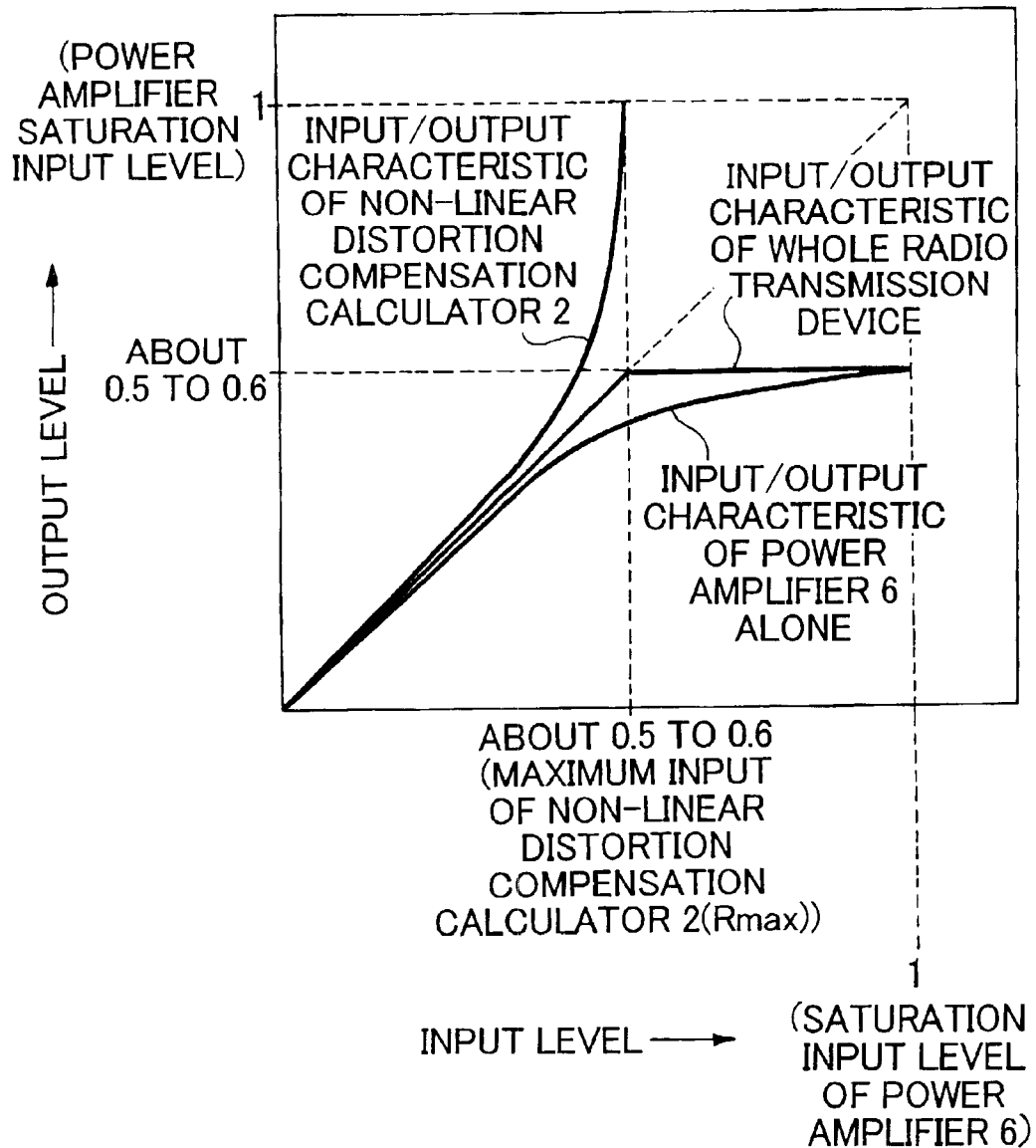
FIG. 7 is a diagram showing the operation of a pre-distortion type distortion compensating circuit.

FIG. 7 is a graph showing the input/output characteristics of the non-linear distortion compensation calculator 2 alone, the power amplifier 6 alone and the whole radio transmission device respectively to the input level which are normalized by the respective rates in the pre-distortion type distortion compensating circuit when the rate of the saturation input level of the power amplifier 6 is set to 1. When no distortion compensation is made, no clipping distortion occurs until the instantaneous amplitude component of the envelope reaches the saturation input level of the power amplifier 6. However, when the distortion compensation is made, as shown by the input/output characteristic of the non-linear distortion compensation calculator 2 alone, the signal amplitude after the compensation reaches the saturation point of the power amplifier 6 even in the case of an instantaneous input amplitude component (about 0.5 to 0.6) which is lower than the saturation input "1" in the case of no distortion compensation, by the gain reducing amount (about 4 dB to 6 dB) from the linear gain of the saturation output point due to the distortion compensation. That is, unlike the case where no distortion compensation is made, the relationship of the output back-off=the input back-off is satisfied in the pre-distortion type distortion compensating circuit. In the following description, the point (about 0.5 to 0.6 in the example of FIG. 7) at which the level after the amplitude compensation in the non-linear distortion compensation calculator 2 reaches the saturation input level of the power amplifier 6 is set as the maximum input value Rmax of the non-linear distortion compensation calculator 2.

In this case, the back-off represents the power ratio of the operation point to the input power or output power at the saturation point, and when the saturation output is equal to 100 W (watt) and the operating power is equal to 10 W, the back-off amount is equal to 10 dB (decibel).

The multiplexed modulation waves based on the CDMA modulation system or the OFDM modulation system can be approximated to a Gauss noise. It may be estimated that the Gauss noise in a narrow band width comprises random amplitude modulation, and the envelope is a Rayleigh distribution. The envelope function (probability density function) can be represented as follows.

$$p(R)=(R/\sigma^2)\cdot\exp(-R^2/2\sigma^2)$$

Here, R=envelope voltage, and $2\sigma^2$=effective voltage value.

FIG. 8 shows he envelope function (probability density function) of the Rayleigh distribution under each back-off condition normalized to the input level which is normalized with the maximum input value Rmax of the non-linear distortion compensating calculator 2 being set to 1. The area that an input level is the maximum input value Rmax or more is an input area in which the output of the power amplifier is saturated. When the instantaneous amplitude component of the envelope reaches this saturation area, clipping distortion occurs. The probability distribution in which the instantaneous voltage amplitude R of the envelope exceeds the maximum input value Rmax can be represented as follows by integrating the envelope function of the Rayleigh distribution from the maximum input value Rmax to ∞.

$$P(R>R\max)=\exp(-R\max^2/2\sigma^2)$$

Accordingly, on the basis of the above calculation equation, the probability distribution of the component in which the instantaneous amplitude of the envelope under each back-off condition exceeds the saturation point is provided as follows. It contains instantaneous amplitude components having large peak factors, and the clipping distortion occurs due to these instantaneous amplitude components.

Under 6 dB back-off operation: about 1.9%
Under 7 dB back-off operation: about 0.7%
Under 8 dB back-off operation: about 0.2%
Under 9 dB back-off operation: about 0.04%
Under 10 dB back-off operation: about 0.005%

In the pre-distortion type distortion compensating circuit, in order to prevent the instantaneous amplitude of the envelope from exceeding the maximum input value Rmax to suppress the clipping distortion caused by the instantaneous amplitude components, the amplitude maximum value at the input point corresponding to (effective value+output back-off) may be limited at the front stage of the distortion compensation calculation from the viewpoint of the relationship of output back-off=input back-off.

Next, the amplitude maximum value limitation based on the circular clipping which is carried out in the amplitude maximum value limiting portion 12 according to this embodiment will be described. When the maximum value limitation is carried out on the digital quadrature baseband signal from the transmission data generator 1, there may be considered rectangular clipping for individually performing the maximum value limitation on each of the I, Q components on the quadrature coordinates and a circular clipping for calculating the power value of the quadrature baseband signal and performing the maximum value limitation on the amplitude value.

Figure 9A:
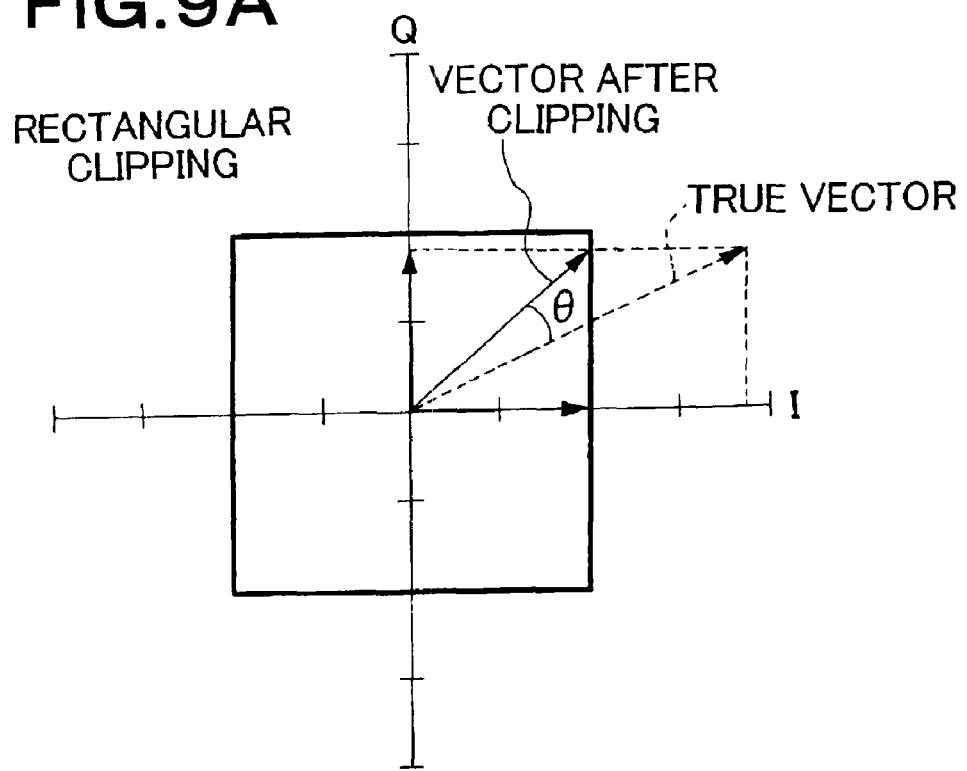
Figure 9B:
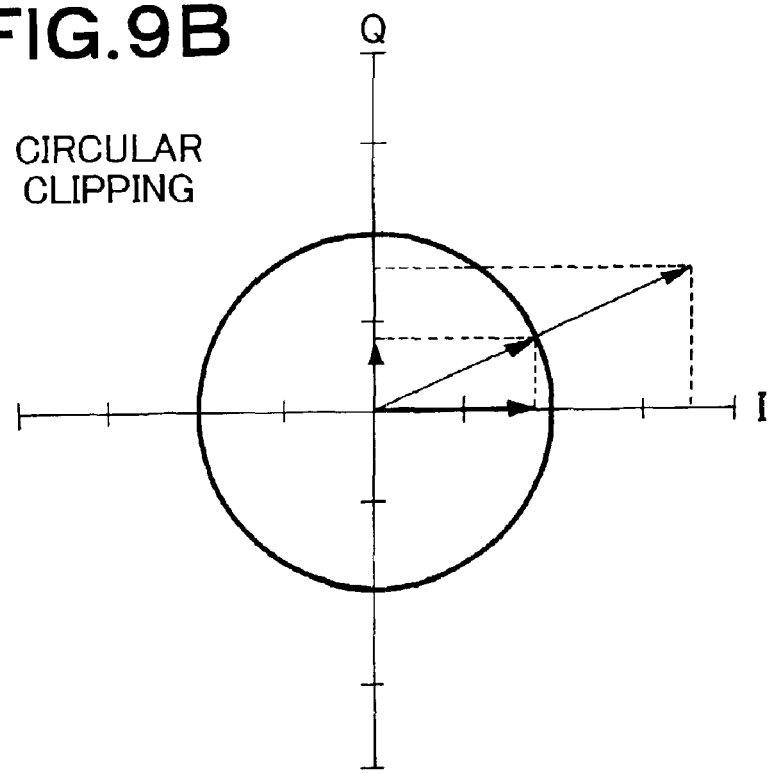

FIGS. 9A and 9B are diagrams showing these maximum limiting methods. FIG. 9A shows the method for performing the maximum limitation every component on the quadrature coordinates by the rectangular clipping, to the digital quadrature baseband signal from the transmission data generator. FIG. 9B shows the method of performing the maximum limitation by the circular clipping, to the digital quadrature baseband signal from the transmission data generator.

When the Q component side of a true vector does not exceed the threshold value of the maximum value limitation although the I component of the true vector exceeds the threshold value of the maximum value limitation, the vector clipped by the rectangular clipping of FIG. 9A has a phase error of θ with respect to the true vector. On the other hand, no phase error occurs in the case of the amplitude maximum value limitation based on the circular clipping of FIG. 9B. The phase error has a great effect on EVM (Error Vector Magnitude) which serves as an index for modulation precision. Further, since the maximum value limitation of the digital quadrature digital baseband signal directly deteriorates EVM, so that the amplitude maximum value limitation based on the circular clipping is more effective to reduce the error caused by the maximum value limiting system to the minimum level. Furthermore, if the maximum value limited by the circular clipping is set to 1, an amplitude value of $2^{1/2}$ times might exist in the amplitude maximum value limitation based on the rectangular clipping. That is, an amplitude value larger than the limited maximum value based on the circular clipping by 3 dB exists as an instantaneous amplitude value, so that the amplitude maximum value limitation based on the circular clipping is also more effective from the viewpoint of the suppression effect of the instantaneous amplitude.

When the power threshold value set by the threshold value setting portion 14 is set on the basis of the output back-off amount of the power amplifier 6, it is required that the deterioration of the modulation precision satisfies the permissible value of the whole transmission system and also the maximum distortion compensating effect is achieved, and this can be easily set in advance by the analysis method as described above.

According to the distortion compensating circuit of this embodiment as described above, the error calculation using the amplitude-limited quadrature baseband signal and amplitude-limited feedback signal is carried out in the distortion compensation data calculator 42 of the error calculation and compensation data renewing unit 11, so that the suppression of the clipping distortion component is implemented without mistaking the error calculation and the subsequent non-linear distortion compensating effect can be greatly enhanced.

Furthermore, the distortion compensating circuit according to this embodiment can be implemented by merely adding a small-scale circuit to the conventional distortion compensating circuit, and it can achieve more excellent distortion compensation characteristics with keeping substantially the same size and power consumption as the conventional compensating circuit.

(Second Embodiment)

Next, a distortion compensating circuit according to a second embodiment of the present invention will be described.

In the distortion compensating circuit of the first embodiment described above, it is judged on the basis of the power threshold value of the digital quadrature baseband signal whether the amplitude limitation is carried out or not. However, according to this embodiment, it is judged on the basis of the amplitude threshold value of the digital quadrature baseband signal whether the amplitude limitation is carried out or not.

Figure 10:
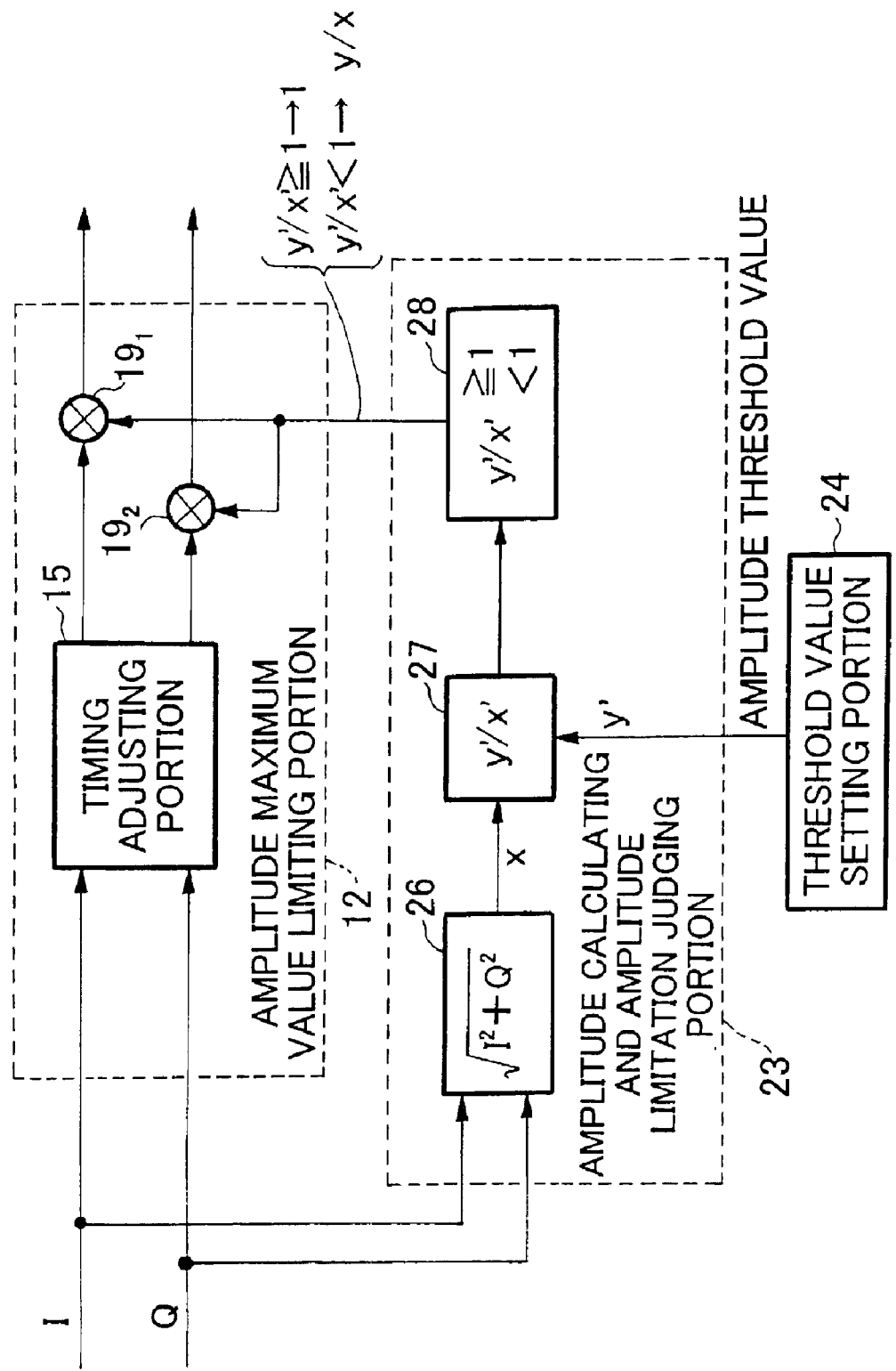
FIG. 10 is a block diagram showing the construction of an amplitude calculating and amplitude limitation judging portion in a distortion compensating circuit according to a second embodiment of the present invention.

As shown in FIG. 10, the construction of the distortion compensating circuit according to this embodiment is achieved by replacing the power calculating and amplitude limitation judging portion 13 and the threshold value setting portion 14 in FIGS. 4, 5 with amplitude calculating and amplitude limitation judging portion 23 and threshold value setting portion 24.

The threshold value setting portion 24 sets a predetermined portion as an amplitude threshold value for the amplitude calculating and amplitude limitation judging portion 23. FIG. 10 shows the construction of the amplitude calculating and amplitude limitation judging portion 23. The amplitude calculating and amplitude limitation judging portion 23 comprises amplitude calculator 26, divider 27 and judging portion 28.

The amplitude calculator 26 calculates the amplitude value x' (square of power value=$(I^2+Q^2)^{1/2}$) of the quadrature baseband transmission signal from the transmission data generator 1. The divider 27 divides the amplitude threshold value y' set in the threshold set portion 24 by the amplitude value x' calculated in the amplitude calculator 26 and outputs the result as a division value y'/x'. The judging portion 28 outputs "1" as a multiplication coefficient when the division value y'/x' calculated by the divider 27 is not less than "1", or outputs y'/x' as a multiplication coefficient when the division value calculated by the divider 27 is smaller than "1".

Subsequently, in the amplitude maximum value limiting portion 12, the adjustment corresponding to the calculation period in the amplitude calculating and amplitude limitation judgment portion 23 is carried out in the timing adjustment portion 15, and then each of the I, Q components of the digital quadrature baseband signal from the transmission data generator 1 is multiplied by the multiplication coefficient output from the judging portion 28, thereby performing the amplitude maximum value limitation based on the circular clipping.

According to the first and second embodiments described above, the present invention is applied to the pre-distortion type distortion compensating circuit. However, the present invention is not limited to these embodiments, and it may be applied to a front stage of a Cartesian feedback type distortion compensating circuit.

As described above, according to the present invention, the amplitude maximum value limitation is carried out by the circular clipping of the quadrature baseband transmission signal on the quadrature coordinates, and then the non-linear distortion compensation is performed, whereby the clipping distortion components can be suppressed without mistaking the error calculation and the effect of the subsequent non-linear distortion compensation can be greatly enhanced.

What is claimed is:

1. A distortion compensating circuit for compensating distortion occurring in amplifying means equipped for a radio transmission device, comprising:

power calculating and amplitude limitation judging means for calculating the power value of a quadrature baseband transmission signal, judging whether the power value thus calculated is not less than a predetermined power threshold value, outputting as a multiplication coefficient such a coefficient that the power value of the quadrature baseband transmission signal is equal to or less than the power threshold value when the power value thus calculated is larger than the power threshold value, and outputting as a multiplication coefficient such a coefficient that the quadrature baseband transmission signal is left unchanged when the power value thus calculated is not larger than the power threshold value;

amplitude maximum value limiting means for performing amplitude maximum value limitation based on circular clipping which is implemented by multiplying each of I and Q components of the quadrature baseband transmission signal by the multiplication coefficient from said power calculating and amplitude limitation judging means;

error calculation and compensation data renewing unit for performing the error calculation between the quadrature baseband transmission signal after the amplitude thereof has been limited by said amplitude maximum value limiting means and the quadrature baseband signal fed back from the output of said amplifying means to renew distortion compensation data for compensating non-linear distortion; and non-linear distortion compensation calculating means for performing, on the basis of the compensation data from said error calculation and compensation data renewing means, distortion compensation on the quadrature baseband transmission signal after the amplitude thereof has been limited by said amplitude maximum value limiting means.

2. The distortion compensating circuit as claimed in claim 1, wherein said power calculating and amplitude limitation judging means calculates the power value x of the quadrature baseband transmission signal, judges whether the power value x is not less than a predetermined power threshold value y, outputs $(y/x)^{1/2}$ as a multiplication coefficient when the power value x thus calculated is larger than the power threshold value y, and outputs 1 as a multiplication coefficient when the power value x thus calculated is not more than the power threshold value y.

3. The distortion compensating circuit as claimed in claim 1, wherein said power calculating and amplitude limitation judging means comprises:

power calculating means for calculating the power value x of the quadrature baseband transmission signal;

dividing means for dividing the predetermined power threshold value y by the power value x calculated by said power calculating means and outputting the division value y/x thus achieved; and judging means for outputting 1 as a multiplication coefficient when the value calculated by said dividing means is not less than 1 and outputting $(y/x)^{1/2}$ as a multiplication coefficient when the value calculated by said dividing means is smaller than 1.

4. The distortion compensating circuit as claimed in claim 2, wherein the power threshold value is set on the basis of an output back-off amount in said amplifying means.

5. The distortion compensating circuit as claimed in claim 3, wherein the power threshold value is set on the basis of an output back-off amount in said amplifying means.

6. A distortion compensating circuit for compensating distortion occurring in amplifying means equipped for a radio transmission device, comprising:

amplitude calculating and amplitude limitation judging means for calculating the amplitude value of a quadrature baseband transmission signal, judging whether the amplitude value thus calculated is not less than a predetermined amplitude threshold value, outputting as a multiplication coefficient such a coefficient that the amplitude value of the quadrature baseband transmission signal is equal to or less than the amplitude threshold value when the amplitude value thus calculated is larger than the amplitude threshold value, and outputting as a multiplication coefficient such a coefficient that the quadrature baseband transmission signal is left unchanged when the amplitude value thus calculated is not larger than the amplitude threshold value;

amplitude maximum value limiting means for performing amplitude maximum value limitation based on circular clipping which is implemented by multiplying each of I and Q components of the quadrature baseband transmission signal by the multiplication coefficient from said amplitude calculating and amplitude limitation judging means;

error calculation and compensation data renewing unit for performing the error calculation between the quadrature baseband transmission signal after the amplitude thereof has been limited by said amplitude maximum value limiting means and the quadrature baseband signal fed back from the output of said amplifying means to renew distortion compensation data for compensating non-linear distortion; and non-linear distortion compensation calculating means for performing, on the basis of the compensation data from said error calculation and compensation data renewing means, distortion compensation on the quadrature baseband transmission signal after the amplitude thereof has been limited by said amplitude maximum value limiting means.

7. The distortion compensating circuit as claimed in claim 6, wherein said amplitude calculating and amplitude limitation judging means calculates the amplitude value x' of the quadrature baseband transmission signal, judges whether the amplitude value x' is not less than a predetermined amplitude threshold value y', output y'/x' as a multiplication coefficient when the amplitude value x' thus calculated is larger than the amplitude threshold value y', and output 1 as a multiplication coefficient when the amplitude value x' thus calculated is not more than the amplitude threshold value y'.

8. The distortion compensating circuit as claimed in claim 7, wherein the amplitude threshold value is set on the basis of an output back-off amount in said amplifying means.

9. The distortion compensating circuit as claimed in claim 6, wherein said amplitude calculating and amplitude limitation judging means comprises:

amplitude calculating means for calculating the amplitude value x' of the quadrature baseband transmission signal;

dividing means for dividing the predetermined amplitude threshold value y' by the amplitude value x' calculated by said amplitude calculating means and outputting the division value y'/x' thus achieved; and judging means for outputting 1 as a multiplication coefficient when the value calculated by said dividing means is not less than 1 or outputting y'/x' as a multiplication coefficient when the value calculated by said dividing means is smaller than 1.

10. The distortion compensating circuit as claimed in claim 9, wherein the amplitude threshold value is set on the basis of an output back-off amount in said amplifying means.

* * * * *